(12) United States Patent
Junger et al.

(10) Patent No.: US 6,696,648 B2
(45) Date of Patent: Feb. 24, 2004

(54) METHOD FOR DISPENSING ADHESIVE ON A CIRCUIT-BOARD CARRIER MEMBER AND CIRCUIT-BOARD PROVIDED THEREBY

(75) Inventors: Klaus Junger, Allmersbach (DE); Willibald Konrath, Cottenweiler (DE)

(73) Assignee: Marconi Communication GmbH, Backaang (DE)

( * ) Notice: Subject to any disclaimer, the term of this patent is extended or adjusted under 35 U.S.C. 154(b) by 0 days.

(21) Appl. No.: 09/928,240

(22) Filed: Aug. 10, 2001

(65) Prior Publication Data

US 2002/0020550 A1 Feb. 21, 2002

(30) Foreign Application Priority Data

Aug. 16, 2000 (EP) .............................. 00117627

(51) Int. Cl.[7] ................................. H05K 1/03
(52) U.S. Cl. ......................... 174/255; 29/832
(58) Field of Search ................. 174/250, 254–257; 29/832

(56) References Cited

U.S. PATENT DOCUMENTS 4,184,133 A    1/1980   Gehle
5,019,944 A  * 5/1991   Ishii et al. .............. 174/138 G
5,125,153 A    6/1992   Frey et al.
5,363,277 A  * 11/1994  Tanaka ................... 174/138 G

FOREIGN PATENT DOCUMENTS

| JP | 59111401 | | 6/1984 | |
| JP | 02135796 A | * | 5/1990 | ............ H02K/3/04 |
| JP | 02263458 A | * | 10/1990 | ............ H01L/23/06 |

* cited by examiner

Primary Examiner—David L. Talbott
Assistant Examiner—Jeremy C. Norris
(74) Attorney, Agent, or Firm—Kirschstein, et al.

(57) ABSTRACT

An adhesive-dispensing method applies a pattern of adhesive onto a circuit-board carrier such that any discontinuities in the pattern, i.e. starting-points, end-points or turning-points, are outside a footprint of a pair of substrates or MMICs intended to be attached, adjacent each other and spaced apart, to the circuit-board, and in particular outside such footprint in the area of transition between one substrate/MMIC and the other. The adhesive is preferably applied in straight lines and in a direction substantially transverse to the direction of transition between the two substrates/MMICs.

29 Claims, 3 Drawing Sheets

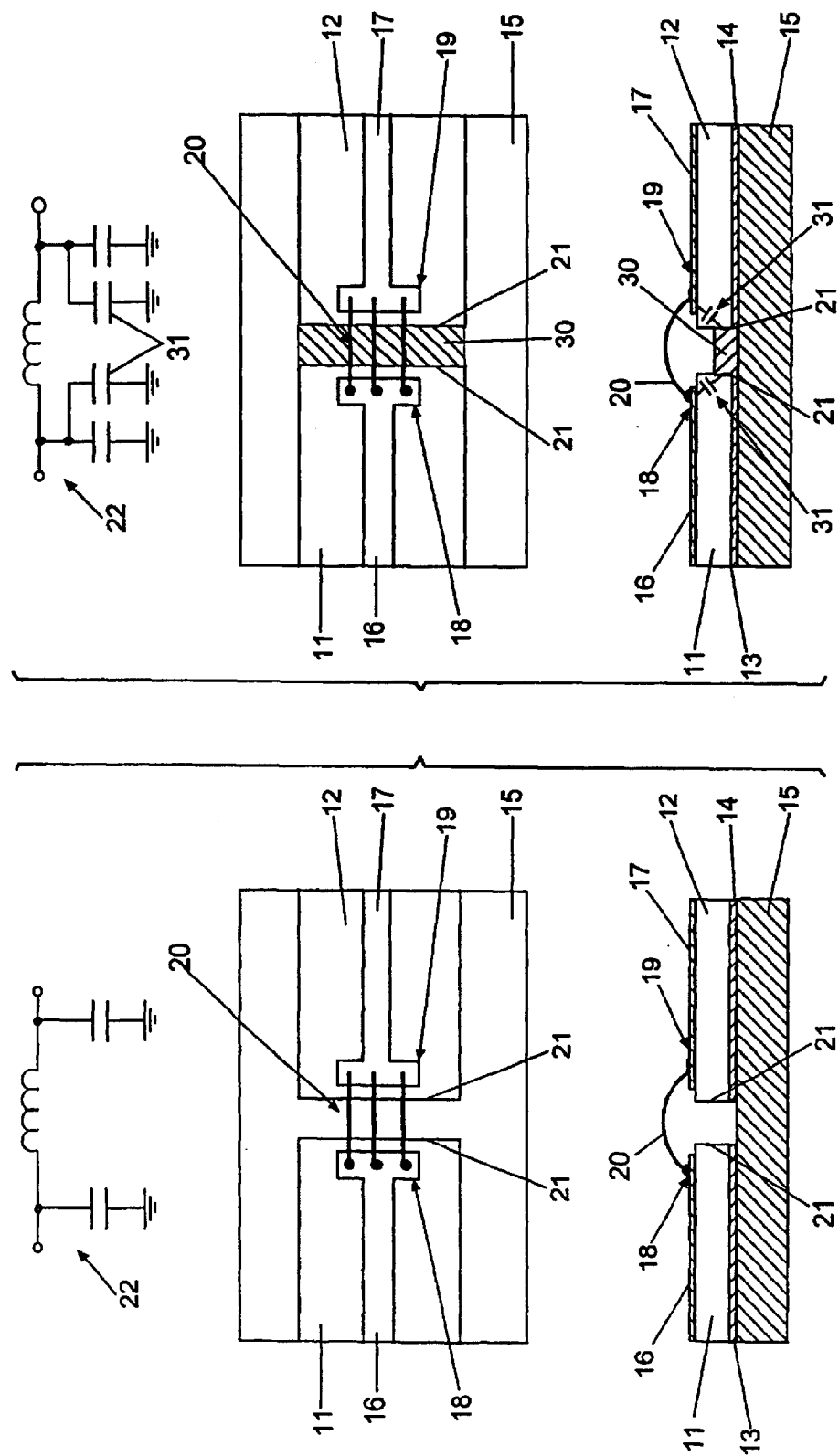

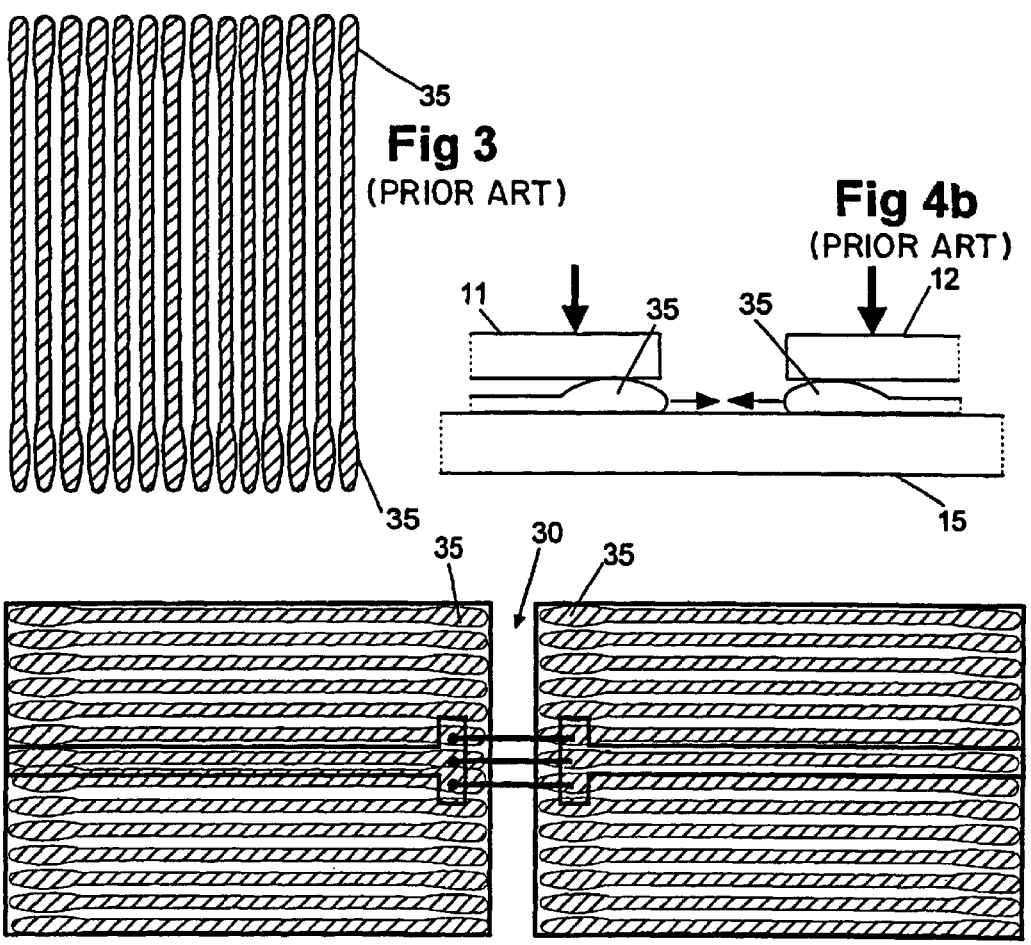
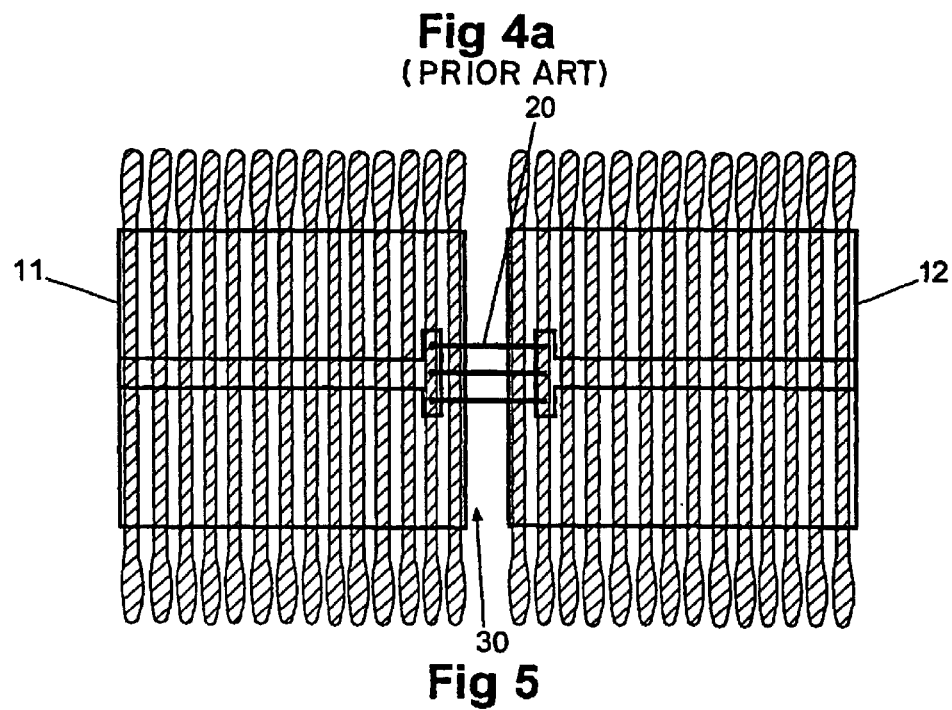

METHOD FOR DISPENSING ADHESIVE ON A CIRCUIT-BOARD CARRIER MEMBER AND CIRCUIT-BOARD PROVIDED THEREBY

BACKGROUND OF THE INVENTION

The invention relates to a method for dispensing adhesive on a circuit-board carrier member and a circuit-board produced by such method.

Circuit-boards for high-frequency use are known which comprise a carrier or some sort of housing member and, mounted thereon, a number of separate components, in particular substrates and/or electronic (mainly active) components. In microwave applications such electronic components may include MMICs. These components are secured to the carrier/housing via an electrically conductive adhesive. The adhesive acts to create electrical continuity between a metallised ground area on the substrate and the grounded carrier. Such an arrangement is shown in FIG. 1, in which two substrates 11, 12 are fixed by adhesive layers 13, 14 to a common carrier 15. Deposited on the two substrates are respective 50 Ω lines 16, 17 which terminate in respective multiple bond-pad sites 18, 19. Linking opposite pairs of sites are wire-bonds 20, which may have been mounted using the well-known ball-and-wedge or wedge-and-wedge bonding techniques.

The wire bonds possess an intrinsic inductance which, in conjunction with a parasitic capacitance associated with the pads 18, 19, gives rise to a low-pass filtering effect 22 on any signal carried by the lines. In order to ensure that the corner-frequency of such a filter is sufficiently and reproducably high relative to the highest frequency of interest in the line signals, the wire-bonds are normally all made of the same length throughout the circuit-board (constant-wire-length (CWL) technique) and the pads are dimensioned and spaced such as to give rise to a low stray capacitance.

In order to ensure that the stray capacitance between the bond-pads 18, 19 and the carrier 15 is sufficiently low, it is advisable to strive for a termination of the adhesive layer at the substrate edge 21 which is as abrupt as possible. Should the adhesive find its way into the gap between the substrates or, worse still, end up covering one or both of the end-faces 22 of the substrates and/or well up into the gap, then the parasitic capacitance increases and the corner-frequency of the low-pass filter decreases, with a consequent deleterious effect on performance. This effect is illustrated in FIG. 2. Here the adhesive can be seen to have welled up into the gap 30, thereby creating new stray capacitance 31 between the bond-pads 18, 19 and the carrier 15.

The conventional way of applying adhesive to the carrier is to spread the adhesive in one of a number of patterns, namely stripes, spots, star-shapes, crosses, double-crosses, etc. One of the commonest patterns is the simple stripe, as shown in FIG. 3. It will be noted that, where each line of adhesive is begun and ended, there is an accumulation of adhesive 35. Similarly, where the adhesive is applied in patterns other than a straight-line pattern, accumulations can also occur at other discontinuities, namely at those points at which the direction of travel of the adhesive is changed. An example of this is a 90° bend, in which accumulations occur at the ends of the angled line and also at the right-angle bend point.

Use of this technique in connection with two adjacent substrates linked by wire-bonds is illustrated in FIGS. 4a and 4b. Here the substrates (or MMICs, for example) are pressed onto the adhesive stripes, which spread slightly under the pressure, thereby partly filling in the inter-stripe gaps, and the adhesive is then allowed to set. Before this occurs, however, the build-ups 35 of adhesive at the end-discontinuities are subject to a squeezing action outwards, as illustrated in FIG. 4b, which then results in adhesive finding its way into the inter-substrate gap 30, as shown also in FIG. 2. Thus, while this known technique satisfies one design requirement, namely that the conductive adhesive should reach as far up to the edge of the substrate as possible in order to provide the best possible grounding of the substrate, it does not satisfy the second requirement, which is that adhesive should not find its way into the intersubstrate gap, thereby increasing stray capacitance.

SUMMARY OF THE INVENTION

In accordance with a first aspect of the invention there is provided a method for dispensing adhesive on a circuit-board carrier member as recited in claim 1 and under a second aspect of the invention there is provided a circuit-board having two components secured to a carrier member by an adhesive as recited in claim 8. Advantageous embodiments of the invention are contained in the sub-claims.

BRIEF DESCRIPTION OF THE DRAWINGS

An embodiment of the invention will now be described, by way of example only, with reference to the drawings, of which:

FIG. 1 is a sectional view and plan-view of a typical circuit-board arrangement involving two substrates and a carrier;

FIG. 2 shows the effect of adhesive migration into a gap separating the two substrates of FIG. 1;

FIG. 3 is an example of an adhesive pattern as applied to the carrier;

FIGS. 4a and 4b illustrate, respectively, a conventional method of securing two neighbouring substrates by adhesive to a carrier, and the effect in such conventional method of the adhesive accumulations at the edges of the substrates when the substrates are mounted;

FIG. 5 depicts a method according to the present invention for securing two neighbouring and interconnected substrates by adhesive to a carrier.

DETAILED DESCRIPTION OF AN EMBODIMENT OF THE INVENTION

Figure 6:
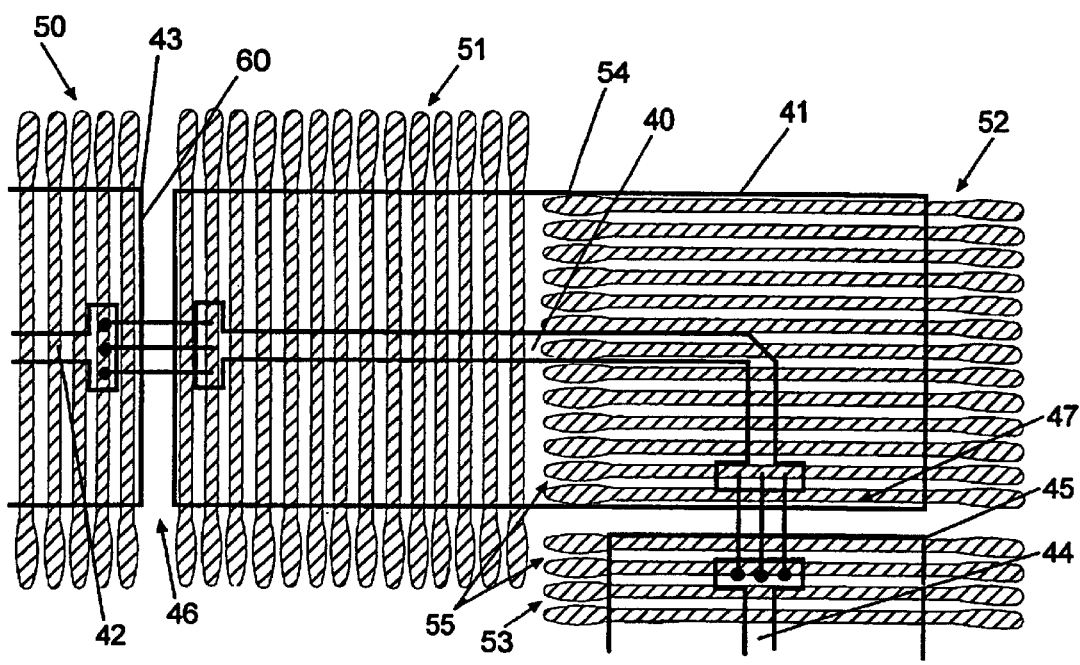
FIG. 6 shows a way according to the present invention of adhesively fixing three neighbouring substrates to a carrier, these substrates involving two orthogonal wire-bond transitions.

Referring now to FIG. 5, which corresponds essentially to the arrangement shown in FIG. 1, two substrates 11, 12 are bonded to a carrier (not shown) by an adhesive applied as stripes, but in this case the stripes are applied at 90° to the direction of the transition between the substrates, i.e. at 90° to the direction of the wire-bonds 20. Since now the accumulations of adhesive occurring at the start and end of each stripe are outside the footprint or area of the substrates, there is far less risk that any adhesive will find itself wandering into the gap 30 and so the stripes nearest the edges of the substrates can be allowed to lie quite close to those edges without fear of migrating into the gap 30. Furthermore, since the portion of each stripe lying underneath each substrate will be substantially uniform in diameter or thickness, when the substrates are pressed downwards onto the adhesive it is less likely that any undesirable gaps (hollow pockets) will arise between the substrates and the adhesive. The result is sound adhesion of the substrate face to the carrier and, at the same time, no build-up of adhesive in the inter-substrate gap to cause performance problems.

A situation in which three substrates are mounted adjacent to each other on a carrier is shown in FIG. 6. In FIG. 6 a line 40 on a first substrate is wire-bonded at one end to a line 42 on a second substrate 43 and at the other end to a line 44 on a third substrate 45. In this case the stripes under the various substrates run as shown, with those 50, 51 either side of the first transition 46 running transverse to the direction of that transition, while those 52, 53 either side of the second transition 47 run transverse to the direction of that transition and also transverse to the direction of the stripes 50, 51.

Whereas in the FIG. 5 scenario all the end-discontinuities of the adhesive stripes lay outside the footprint of the two substrates, so that it was assumed that the width and height above the carrier of the stripes within that footprint was more or less constant over that footprint, in the FIG. 6 case the adhesive build-ups 54 at one end of the stripes 52 lie within the footprint of the substrate 41. This can have the less-than-ideal effect that some gaps may occur between that substrate and the various adhesive stripes following mounting of the substrate on the carrier. Notwithstanding this, however, the build-ups 54 are still outside the area of the transition 47 and therefore the stripes 55 at the facing edges of the substrates 41 and 45 can still lie quite close to those edges without risk of migration of adhesive into the gap between those substrates.

Although the various drawings show the adhesive as running at 90° to the direction of transition, it is not necessary that this be exactly 90° in order to enjoy the benefits of the invention. However, it is best to have the adhesive running as parallel to a transition-edge of the substrate concerned as possible (see, for example, the transition-edge 60 in FIG. 6), since then there will be optimal coverage of the adhesive up to all points along the substrate edge.

While in FIG. 5, for example, all the adhesive stripes associated with the substrates 11, 12 are oriented in the same direction, in practice it is only necessary for those in the immediate vicinity of the transition between the two substrates to have the orientation shown; the others may have a different orientation (e.g. parallel to the direction of transition), if required. However, in that case as already mentioned in connection with FIG. 6 there may be an increased risk of gaps occurring in places between the underside of the substrate and the adhesive due to the possible existence of adhesive accumulations within the footprint of the substrates in the non-transition regions.

What is claimed is:

1. A method of dispensing an electrically conductive adhesive on, and in electrical continuity with, a carrier to resist a flow of the adhesive into a gap bounded by adjacent components placed at respective footprints onto, and secured by the adhesive on, the carrier, the components carrying electrical signals and being interconnected by an overhead electrical conductor spanning the gap at a junction, the method comprising the steps of:
   a) starting the dispensing of the adhesive at a starting area on the carrier prior to placement of the components,
   b) continuing the dispensing of the adhesive in a pattern on the carrier prior to interrupting the dispensing of the adhesive at an ending area, the pattern having a lesser quantity of the adhesive at the junction as compared to a greater quantity of the adhesive at each of the starting and ending areas to resist the flow of the adhesive into the gap at the junction after placement of the components, and
   c) locating the starting and ending areas away from the junction.

2. The method of claim 1, wherein at least one of the starting and ending areas is outside the footprints and the gap.

3. The method of claim 1, wherein the starting and ending areas are located at opposite ends of a line of which the pattern is comprised.

4. The method of claim 1, wherein the starting step is performed a plurality of times to form a plurality of starting areas, wherein the interrupting step is performed a plurality of times to form a plurality of ending areas, and wherein the pattern is comprised of a plurality of lines each having one of the starting areas and one of the ending areas at opposite ends of a respective line.

5. The method of claim 4, wherein the lines are formed in mutual parallelism.

6. The method of claim 4, wherein the lines are linear.

7. The method of claim 4, wherein all of the starting and ending areas are located outside the footprints and the gap.

8. The method of claim 1, wherein the dispensing of said lesser quantity of the adhesive at the junction is performed by dispensing an adhesive line of uniform height above the carrier.

9. The method of claim 1, wherein the dispensing of said lesser quantity of the adhesive at the junction is performed by dispensing an adhesive line of uniform width transverse to the adhesive line.

10. The method of claim 1, wherein the dispensing of said lesser quantity of the adhesive is continuously performed across the junction.

11. The method of claim 10, wherein the dispensing of said lesser quantity of the adhesive is applied in a direction transverse to the electrical conductor across the junction.

12. The method of claim 11, wherein said direction remains constant.

13. A circuit arrangement, comprising:
   a) a carrier;
   b) an electrically conductive adhesive on, and in electrical continuity with, the carrier;
   c) a plurality of adjacent components carrying electrical signals and bounding a gap and placed at respective footprints onto, and secured by the adhesive on, the carrier;
   d) an overhead electrical connector interconnecting the components and spanning the gap at a junction; and
   e) the adhesive being applied in a pattern beginning at a starting area and interrupted at an ending area, the pattern having a lesser quantity of the adhesive at the junction as compared to a greater quantity of the adhesive at each of the starting and ending areas to resist a flow of the adhesive into the gap at the junction after placement of the components, the starting and ending areas being located away from the junction.

14. The arrangement of claim 13, wherein at least one of the starting and ending areas is outside the footprints and the gap.

15. The arrangement of claim 13, wherein the starting and ending areas are located at opposite ends of a line of which the pattern is comprised.

16. The arrangement of claim 13, wherein the pattern has a plurality of starting areas, a plurality of ending areas, and a plurality of lines each having one of the starting areas and one of the ending areas at opposite ends of a respective line.

17. The arrangement of claim 16, wherein the lines are linear and in mutual parallelism.

18. The arrangement of claim 16, wherein all of the starting and ending areas are located outside the footprints and the gap.

19. The arrangement of claim 13, wherein the pattern includes an adhesive line of uniform height and width extending in a direction across the junction.

20. The arrangement of claim 19, wherein the direction of the adhesive line is constant and transverse to the conductor.

21. A method of dispensing an electrically conductive adhesive on a circuit-board carrier member for securing thereto, and providing electrical continuity thereto, of a first electrical component and a second electrical component, the electrical components being secured in an adjacent spaced relationship to the carrier member, the electrical components being electrically interconnected in an area of adjacency by means of at least one electrical conductor connected to an upper surface of each electrical component that is distal to the carrier member, the method comprising the steps of: dispensing the electrically conductive adhesive onto the carrier member in a predefined pattern beginning at a starting point and ending at an end point, and ensuring that there are no starting and end points in the predefined pattern within an anticipated footprint of the electrical components in the vicinity in which the electrical components are to be interconnected to thereby ensure that no adhesive enters a space between the electrical components when the electrical components are mounted to the carrier member.

22. The method as claimed in claim 21, and comprising dispensing the electrically conductive adhesive continuously in the anticipated footprint of the electrical components in the vicinity in which the electrical components are to be interconnected.

23. The method as claimed in claim 21, and comprising dispensing the electrically conductive adhesive to form the predefined pattern of a plurality of lines.

24. The method as claimed in claim 23, and comprising dispensing the electrically conductive adhesive to form the predefined pattern of a plurality of substantially parallel lines.

25. The method as claimed in claim 23, and comprising dispensing the electrically conductive adhesive in the form of a plurality of substantially straight lines.

26. The method as claimed in claim 23, and comprising dispensing the electrically conductive adhesive in the form of a plurality of lines of substantially constant width in a plane parallel to a major face of the carrier member over a portion of the lines which lie within the footprint.

27. The method as claimed in claim 23, and comprising dispensing the electrically conductive adhesive in the form of a plurality of lines of substantially constant height above the carrier member over a portion of the lines which lie within the footprint.

28. The method as claimed in claim 21, and comprising dispensing the electrically conductive adhesive onto the carrier member in the predefined pattern while ensuring that all starting and end points in the predefined pattern lie outside the footprint of the electrical components and are remote from the vicinity in which the electrical components are to be interconnected.

29. The method as claimed in claim 21, and comprising dispensing the electrically conductive adhesive in lines that run in a direction which is substantially transverse to the direction of the at least one electrical conductor interconnecting the electrical components.

* * * * *

UNITED STATES PATENT AND TRADEMARK OFFICE
CERTIFICATE OF CORRECTION

PATENT NO. : 6,696,648 B2
APPLICATION NO. : 09/928240
DATED : February 24, 2004
INVENTOR(S) : Junger et al.

It is certified that error appears in the above-identified patent and that said Letters Patent is hereby corrected as shown below:

On the Title Page, Item (73) Assignee: delete "Marconi Communication GmbH, Backaang (DE)" and insert -- Marconi Communications GmbH, Backnang (DE) --, therefor.

Signed and Sealed this

Eleventh Day of November, 2008

JON W. DUDAS
*Director of the United States Patent and Trademark Office*